United States Patent [19]

Hönig et al.

[11] 4,363,979

[45] Dec. 14, 1982

[54] EVALUATION CIRCUIT FOR ELECTRICAL SIGNALS

[75] Inventors: Gunter Hönig, Ditzingen; Joachim Braunger, Remseck; Imanuel Krauter, Erbstetten; Rainer Bone, Vaihigen, all of Fed. Rep. of Germany

[73] Assignee: Robert Bosch GmbH, Stuttgart, Fed. Rep. of Germany

[21] Appl. No.: 209,505

[22] Filed: Nov. 24, 1980

[30] Foreign Application Priority Data

Nov. 30, 1979 [DE] Fed. Rep. of Germany ....... 2948198

[51] Int. Cl.[3] ........................ H03L 5/00; H03K 13/02; H03K 9/06

[52] U.S. Cl. ...................................... 307/519; 307/264

[58] Field of Search ........................ 307/519, 515, 264; 328/140

[56] References Cited

U.S. PATENT DOCUMENTS

| | | | |
|---|---|---|---|
| 3,872,388 | 3/1975 | James | 307/519 |
| 4,166,248 | 8/1979 | Bianchi et al. | 307/264 |
| 4,234,940 | 1/1981 | Ruof | 328/140 |

FOREIGN PATENT DOCUMENTS

| | | | |
|---|---|---|---|
| 2843981 | 4/1980 | Fed. Rep. of Germany | 307/519 |

*Primary Examiner*—John S. Heyman

*Attorney, Agent, or Firm*—Frishauf, Holtz, Goodman & Woodward

[57] ABSTRACT

Signals from a coil producing pulses in response to flux variations produced by a rotary member driven by an engine crankshaft are applied in push-pull through series resistors to the inverting and non-inverting inputs of a comparator. A variable voltage divider for the input signals is provided by a pair of complementary transistors respectively connecting the comparator inputs to opposite poles of a fixed voltage supply. The comparator pulses charge a capacitor through a transistor, the capacitor being periodically discharged through a resistor, once per crankshaft revolution. An increase of capacitor voltage beyond a very small amount progressively lowers the resistances provided by the transistors connected to the comparator inputs, acting on one of them simply through a transistor and on the other through a transistor and a current mirror circuit. In order to compensate for the temperature dependent leakage current of the transistor driven by the comparator output in order to charge the capacitor, a second current mirror is provided that prevents charging of the capacitor during the blocked-condition of the transistor in question. A supplementary voltage divider is connected through isolating series resistors to set the d.c. level of the comparator inputs when the transistors connected to these inputs are non-conducting.

8 Claims, 1 Drawing Figure

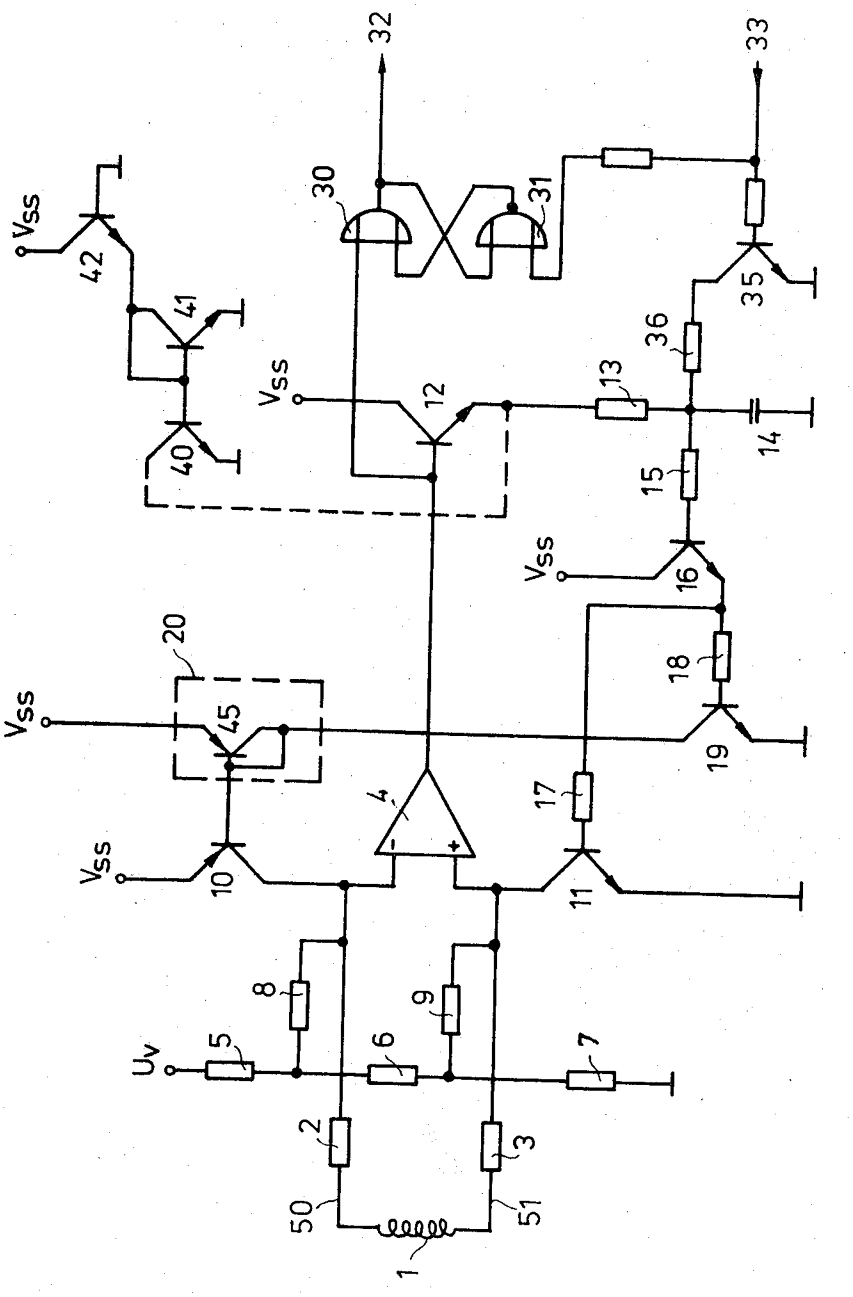
32
33
30
31
Vss
42
41
40
12
13
36
35
14
15
16
18
17
19
20
45
4
10
11
8
9
5
6
7
Uv
2
3
50
51
1

EVALUATION CIRCUIT FOR ELECTRICAL SIGNALS

The invention concerns an evaluation circuit for electrical signals produced by an inductive transducer that responds to the rotation of a rotary member of variable speed, such as may be provided in an automobile engine to provide a speed signal. In particular, the invention concerns a preliminary processing of such electrical signals, which are provided at an amplitude that varies with the rotary speed of the shaft, in order to produce signals of a form more suitable for use in analog or digital computing or control circuits.

The signals delivered by an inductive transducer, particularly the kind that responds to the nearby rotating periphery of a toothed wheel or the like, can vary in amplitude from nearly zero to a few hundred volts, according to the rate at which the magnetic flux changes.

In published German patent application OS No. 28 43 981.8, an evaluation circuit for such a transducer was disclosed in which the signals were supplied to the non-inverting input of an operational amplifier, of which the output was connected on one hand to a capacitor the other terminal of which was grounded and, on the other hand, to the control electrode of a transistor utilized as a controllable resistance, so as to provide by this controllable resistance, together with a resistance in series with the transducer, a voltage divider of which the tap is connected to the signal input of the comparator, for the purpose of thereby regulating the amplitude of the signals supplied to the comparator. In this known circuit, the inverting input of the comparator is supplied with a fixed comparison voltage. As background for the description of the present invention, the entire contents of the above publication and corresponding U.S. patent application are hereby incorporated by reference.

The Invention

It is an object of the invention to provide an evaluation or preprocessing circuit, for the signals of an inductive transducer that are subject to amplitude variation, which is more effective in reducing the amplitude variation than is the case with the abovementioned known circuit, while at the same time involving at most only a slight increase in cost.

Briefly, the signals of the inductive transducer are provided in phase opposition (push-pull) respectively to the inverting and non-inverting inputs of the comparator through series resistances and the inputs of the comparator are respectively connected, through controllable resistances preferably constituted in each case by a transistor, to fixed voltages of opposite polarity, these controllable resistors being simultaneously varied in value in accordance with the charge of a capacitor, which is charged up by the output of the comparator. Preferably, one of the controllable resistors is controlled by the capacitor charge and the other is controlled by a current mirror circuit in response to the capacitor charge and preferably the transistors providing the controllable resistances are of complementary type. It is It is particularly advantageous to provide a controllable switch in series with a discharge resistor for discharging the capacitor. It is also particularly useful for the output of the capacitor to charge the capacitor through a controllable switch, preferably a transistor and, furthermore, to provide compensation for temperature dependent blocking-state current of the transistor by means of a second current mirror circuit.

The balanced circuit interconnecting the transducer and the comparator has the advantage that it provides progressively heavier voltage division and thereby the greater reduction of the voltages effective at the input of the comparator, the higher the charge voltage of the capacitor is. In this fashion, it is possible to obtain an approximately constant signal amplitude at the inputs of the comparator, even under conditions of strongly varying signal amplitudes within the control range of the circuit. There is the further advantage, particularly in contrast with the above-described known circuit, that the sensitivity of the circuit to disturbing pulses is reduced, since such disturbing pulses which can, for example, result from the ignition circuits of an engine, superimpose their effects in the same phase on both comparator inputs, whereas the comparator responds only to signals applied in phase opposition there. The control of complementary transistors functioning as variable resistors by the use of a current mirror for one of them and a more direct control for the other provides a simple and inexpensive manner of utilizing the capacitor voltage to reduce the sensitivity of the comparator inputs to increased amplitude of the transducer signals. By suitable choice of the d.c. voltages supplied to the comparator, the comparator threshold for very small signals, i.e. when the transistors constituting the variable resistances are blocked, can be suitably chosen.

The preferred circuit for providing intermittent discharge of the capacitor, instead of continuous discharge by a parallel resistor, makes it possible for external control of the discharge and thereby of the time constant of discharge through a computer present in a vehicle, for example, so as to produce discharge of the capacitor to a desired extent. This offers also the possibility to make the discharge of the capacitor depend upon driving conditions in the case of a motor vehicle engine control system, for example to provide that a high vehicle travel speeds, when the signals provided by the inductive transducer accordingly have a high voltage, the capacitor is more greatly discharged during a revolution of the crankshaft than at low driving speeds, this being done in spite of the fact that a revolution of the crankshaft at high engine speed, and hence at high driving speeds, takes less time than at low engine speed.

The feature of charging the capacitor through a transistor has the advantage that the currents and voltages available for charging are independent of the particular comparator type that may be chosen, while the use of the second current mirror, as above mentioned, makes the charging of the capacitor through a transistor reliably independent of temperature effects.

THE DRAWINGS

The invention is described in further detail by way of illustrative examples, with reference to the annexed drawings, in which:

The FIGURE is a circuit diagram of an evaluation circuit according to the invention;

DESCRIPTION OF THE ILLUSTRATED EMBODIMENTS

The two terminals of a sensor winding 1 of an inductive transducer responsive to the stray field of an iron-containing rotor are connected through resistors 2 and 3 respectively with the inverting and non-inverting inputs of a comparator 4, as shown in the drawings. A series combination of three resistors 5, 6 and 7 interposed between a positive voltage Uv and ground provides a voltage divider of which one tap, the common connection of resistors 5 and 6, supplies the voltage over the resistor 8 to the inverting inputs and the other tap provided by the common connection of the resistors 6 and 7 supply the voltage through a resistor 9 to the non-inverting input of the comparator 4. The resistances 8 and 9 serve to reduce the damping by the voltage divider 5,6,7 of the signals delivered by the sensing coil 1 of the transducer.

At the inverting input of the comparator 4, there is connected the collector of a pnp transistor 10 that has a positive voltage Vss applied to its emitter, while at the non-inverting input of the comparator there is connected the collector of an npn transistor 11 of which the emitter is grounded. The output of the comparator 4 is connected to the base of an npn transistor 12, the collector of which has the voltage Vss applied to it while its emitter is connected through a resistor 13 with one terminal of a capacitor 14, of which the other terminal is grounded. The common connection of the resistor 13 and the capacitor 14 is connected through a protective resistor 15 with the base of an npn transistor 16, of which the collector has the voltage Vss applied to it, and the emitter is connected respectively through resistors 17 and 18 of equal value to the bases of transistors 11 an 19, the latter being an npn transistor like the transistor 11 having its emitter also grounded. The collector of the transistor 19 is connected with a terminal of a current mirror 20 which is also connected to the base of the transistor 10 and serves to assure that the voltage division of these signals delivered by the sensing winding 1, produced by these transistors 10 and 11 in cooperation with the resistances 2 and 3, is equally large at the respective inputs of the comparator 4.

The output of the comparator 4 controls a flipflop composed of two NOR-gates 30 and 31. The output 32 of the flipflop has a low voltage value when the output signal of the comparator 4 has high voltage value. A resetting signal can be supplied to a second input of the flipflop 30,31 from an input terminal 33 of the illustrated circuit. This reset signal at the same time turns on a transistor 35 that has its emitter grounded and its collector connected through a resistor 36 with the common connection of the resistor 13 and the capacitor 14. So long as the transistor 35 is conducting, it accordingly produces a discharge of the capacitor 14 corresponding to the time constant dependent upon the values of the capacitor 14 and the resistor 36. The input 33 can be connected to the output of a computer that causes the capacitor voltage to be more or less reduced as a function of the speed of the rotary member to which the sensing winding 1 is responsive.

A broken line connection in the FIGURE shows that an additional current mirror that contains, as shown, the transistors 40,41 and 42, can be connected to the emitter of the transistor 12 in order to prevent the temperature-dependent leakage current of the transistor 12 from charging the capacitor 14, when the output signal of the comparator 4 has a low voltage value, so that the transistor 12 is in the shut-off condition. The transistors 40 and 41 are of identical construction and are located spatially close together so that they are always at the same temperature, and the transistor 42 is of a construction identical with the transistor 12 and likewise has the same temperature, so that the emitter current of the transistor 42, i.e. its blocked-condition current, is exactly equal in magnitude to that of the blocked condition current of the transistor 12, at least to a sufficiently close approximation. The blocked-condition current of the transistor 12 is thereby drained away by the transistor 40 and cannot reach the capacitor 14.

The constitution of the current mirror 20 is plain from the drawing. This current mirror contains a pnp transistor 45 connected as a diode.

Operation

Let it be assumed that the sensor coil 1 responds to the teeth of a gear-like wheel that is connected directly or indirectly by the crankshaft of a motor vehicle and that a predetermined number of control pulses per revolution of the crankshaft, for example a single pulse per revolution, is supplied to the input 33 of the circuit to make the transistor 35 temporarily conducting. When the sensor winding 1 is providing very small signals that are sufficient, however, to enable the comparator to respond, which is to say that the comparator threshold voltage is overstepped, the output of the signal of the comparator 4 goes to a high value only for short periods and the transistor 12 is accordingly only briefly turned on, so that the capacitor 14 is only slightly charged. Since the capacitor, moreover, is periodically discharged again through the transistor 35, the voltage built up on the capacitor 14 is insufficient to bring the transistors 10 and 11 out of the blocking condition into a conducting condition through the transistors 16 and 19 and the current mirror 20. The output signal of the sensor winding 1 is therefore supplied unchanged to the comparator 4.

If now the amplitude of the signal increases, the output signal of the comparator 4 is put at a high voltage for longer periods of time and accordingly the capacitor 14 is more greatly charged. This higher voltage at the capacitor 24 is sufficient to cause a current dependent magnitude upon the voltage at the capacitor 14 to flow through the transistors 10 and 11, and the amplitude of the signals acting on the inputs of the comparator 4 is thereby reduced by voltage division.

If care is taken that the leads 50 and 51 leading to the circuit from the coil 1 are exposed in the same way to disturbance sources that are present, for example by twisting the wires together or at least causing them to run along side each other, the disturbances, as for example the disturbances produced by the ignition system of the engine, act in the same phase on both inputs of the comparator 4 and are therefore suppressed in the circuit.

The magnitude of the resistance 36 and the level of the charge in the capacitor 14 influence the magnitude of the discharge current when the transistor 35 conducts. If the discharge current is to be independent of the charge voltage, a current source is provided for the discharge rather than a simple parallel resistance.

The manner of operation of the circuit containing the transistors 40,41 and 42 of the circuit containing the transistor 45, which circuits are referred to above as "current mirrors", is described in the handbook published by Interdesign entitled "IC Lecture Series", p. 57-3/31 and 3/32, and also p. 61-3/45. The operation of these circuits, therefore, does not need to be described further here.

Although the invention has been described with reference to particular illustrative embodiments, it will be understood that other modifications and variations are possible within the inventive concept.

We claim:

1. An evaluation circuit for providing processible binary signals from electric signals supplied by an inductive transducer in a manner dependent on the speed of a rotating shaft and having an amplitude increasing with the speed of rotation of said shaft, said circuit comprising:

means for coupling a pair of terminals of said transducer supplying the output signal thereof in phase opposition respectively to the inverting and non-inverting inputs of a comparator (4), said coupling means including series resistances (2,3) each connected between one of said terminals and one of said comparator inputs;

a pair of electrically controllable resistances controllable in the magnitude of their respective resistance, values connected between respective comparator inputs and different constant potentials;

capacitor means (14) connected at the comparator output for charging thereof in a manner dependent upon the output signal of said comparator, and means connected between said capacitor means and said resistances (10,11) for reducing said resistance values thereof as the charge voltage of said capacitor increases, whereby said controllable resistances and said series resistances are caused to cooperate to reduce the effective voltage at said inputs of said comparator by voltage division with increasing speed of said shaft.

2. A circuit as defined in claim 1, in which said controllable resistances are constituted by transistors (10,11).

3. A circuit as defined in claim 2, in which said transistors are of complementary types and said means for reducing said resistance values comprises a current mirror circuit (20) coupling one of said transistors with said capacitor (14).

4. A circuit as defined in claim 1, in which a voltage divider (5,6,7) connected to a voltage source (Uv) is connected through isolating resistors (8,9) to said inputs of said comparator for applying d.c. voltages thereto.

5. A circuit as defined in claim 3, in which the series combination of a discharge resistance (36) and a controllable switch (35) for switching said discharge resistor in and out is connected in parallel with said capacitor (14).

6. A circuit as defined in claim 3, in which a current source is connected in parallel to said capacitor (14) for discharging said capacitor at a rate determined by said current source.

7. A circuit as defined in claim 1, in which a controllable switch (12) responsive to the output signal of said comparator (4) is provided through which said capacitor (14) is arranged to be charged.

8. A circuit as defined in claim 7, in which said controllable switch (12) responsive to the output signal of said comparator (14) is a transistor, and in which a second current mirror circuit (40,41,42) is provided for compensating the effect of temperature dependence current present in said transistor in its blocking condition.

* * * * *